United States Patent [19]
Fiedler et al.

[11] Patent Number: 5,714,912
[45] Date of Patent: Feb. 3, 1998

[54] VCO SUPPLY VOLTAGE REGULATOR

[75] Inventors: Alan Fiedler, Minneapolis; Iain Ross Mactaggart, Eden Prairie, both of Minn.

[73] Assignee: LSI Logic Corporation, Milpitas, Calif.

[21] Appl. No.: 701,742

[22] Filed: Aug. 22, 1996

[51] Int. Cl.$^6$ .................. H03B 5/24; H03B 5/04; H03K 3/011; H03L 1/00
[52] U.S. Cl. .................. 331/57; 331/175; 331/177 R; 331/186; 327/280; 327/281; 327/541
[58] Field of Search .................. 331/34, 57, 108 C, 331/116 FE, 175, 177 R, 185, 186; 327/270, 274, 276–282, 538, 540, 541, 543

[56] References Cited

U.S. PATENT DOCUMENTS 5,075,643 12/1991 Einbinder .................. 331/185 X
5,097,228 3/1992 McJunkin .................. 331/176
5,485,126 1/1996 Gersbach et al. .................. 331/57
5,568,099 10/1996 Du .................. 331/186 X

*Primary Examiner*—David Mis
*Attorney, Agent, or Firm*—Westman, Champlin & Kelly, P.A.

[57] ABSTRACT

A voltage-controlled oscillator includes at least one voltage-controlled delay element and a reference voltage generator. The voltage-controlled delay element has first and second voltage supply inputs, a control voltage input, a signal input and a signal output. The reference voltage generator has a voltage input coupled to the control voltage input and a voltage output coupled to the first voltage supply input.

16 Claims, 5 Drawing Sheets

5,714,912

1

VCO SUPPLY VOLTAGE REGULATOR

BACKGROUND OF THE INVENTION

The present invention relates to voltage controlled oscillators (VCOs) and, in particular, to a supply voltage regulator for a VCO.

A certain class of voltage-controlled oscillators are built from a series of inverting delay elements, with the output of each delay element connected to the input of the next delay element. When the number of inverting delay elements is odd and other conditions are met, the series of inverting delay elements will oscillate. The propagation delay through each delay element is typically set by the current available in the delay element to charge and to discharge the load present at its output. By controlling this current, the propagation delay and thus the frequency of oscillation is thereby controlled. The current available in each delay element is typically set by a voltage, hence the frequency of oscillation is voltage-controlled.

Voltage-controlled oscillators are used in a variety of applications, including phase-locked loops (PLLs). A PLL is constructed by combining a VCO in a closed-loop with a phase detector, a charge pump and a filter. The performance of the PLL regarding the spectral content of the signal at the VCO output is dependent on, among other things, the sensitivity of the VCO frequency to changes in power supply voltage. This parameter is commonly referred to as VCO power supply gain, and is specified in MHz/V. There is a continuing need for VCOs having a very low VCO power supply gain.

SUMMARY OF THE INVENTION

The voltage-controlled oscillator of the present invention includes at least one voltage-controlled delay element and a reference voltage generator. The voltage-controlled delay element has first and second voltage supply inputs, a control voltage input, a signal input and a signal output. The reference voltage generator has a reference voltage input coupled to the control voltage input and a voltage output coupled to the first voltage supply input.

In one embodiment, the voltage-controlled oscillator of the present invention further includes an operational amplifier coupled in a voltage follower configuration between the voltage output and the first voltage supply terminal. The reference generator further includes an N-channel source follower and a P-channel source follower coupled together in series between the reference voltage input and the voltage output. The reference generator outputs a reference VCO supply voltage on the voltage output that is referenced to the control voltage applied at the control voltage input and is substantially independent of changes in VDD. Thus, the VCO power supply gain is very low. With the VCO supply voltage referenced to the control voltage, the delay element has the widest possible control voltage range over which transistors that supply current within the delay element remain in saturation.

2

Figure 3:
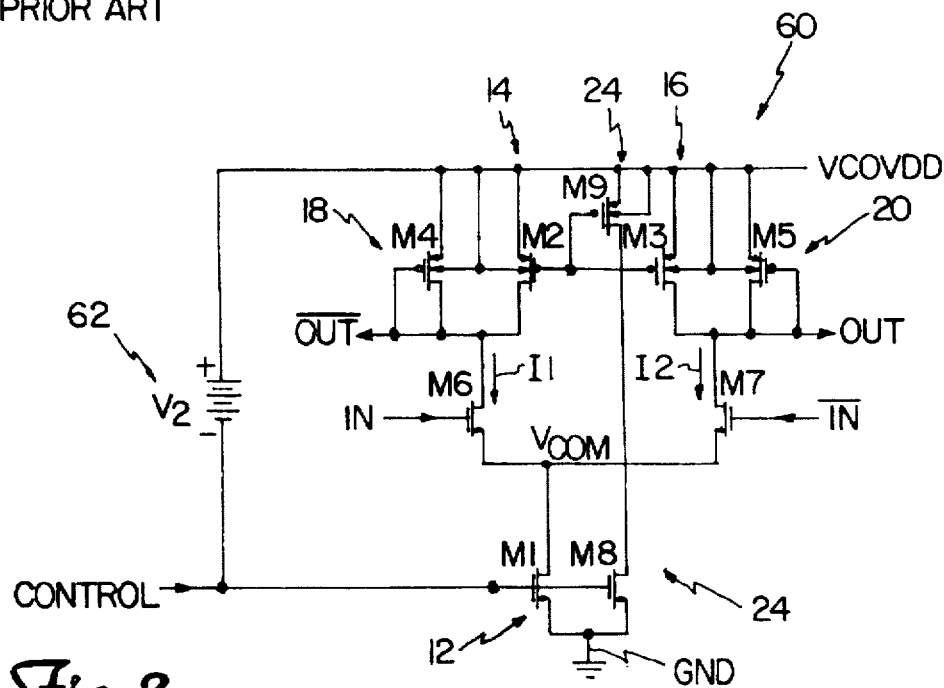
FIG. 3 is a schematic diagram of a differential delay element according to the present invention.
Figure 4:
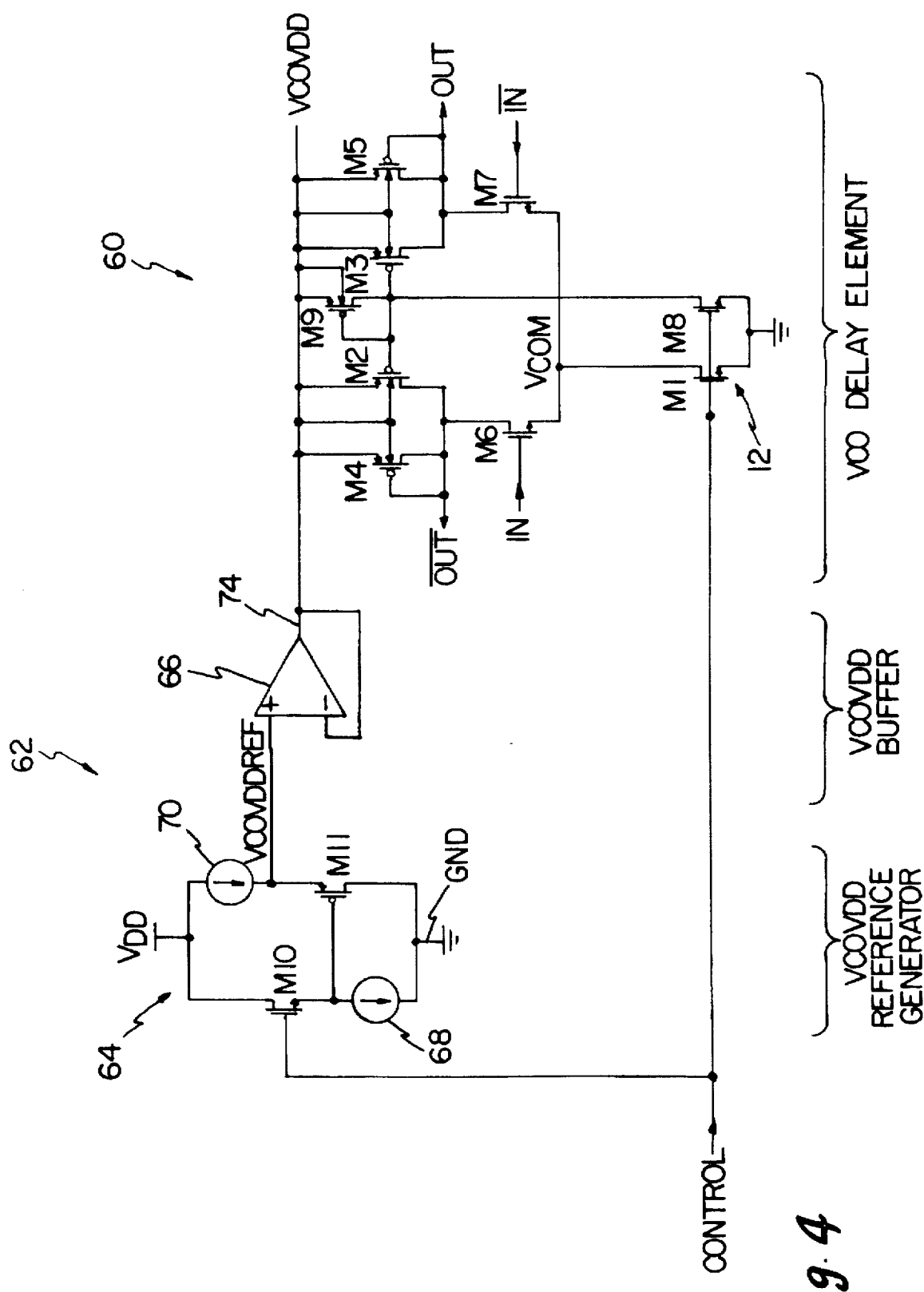

FIG. 4 is a schematic diagram of the differential delay element shown in FIG. 3 which illustrates a reference generator in greater detail.

Figure 5:
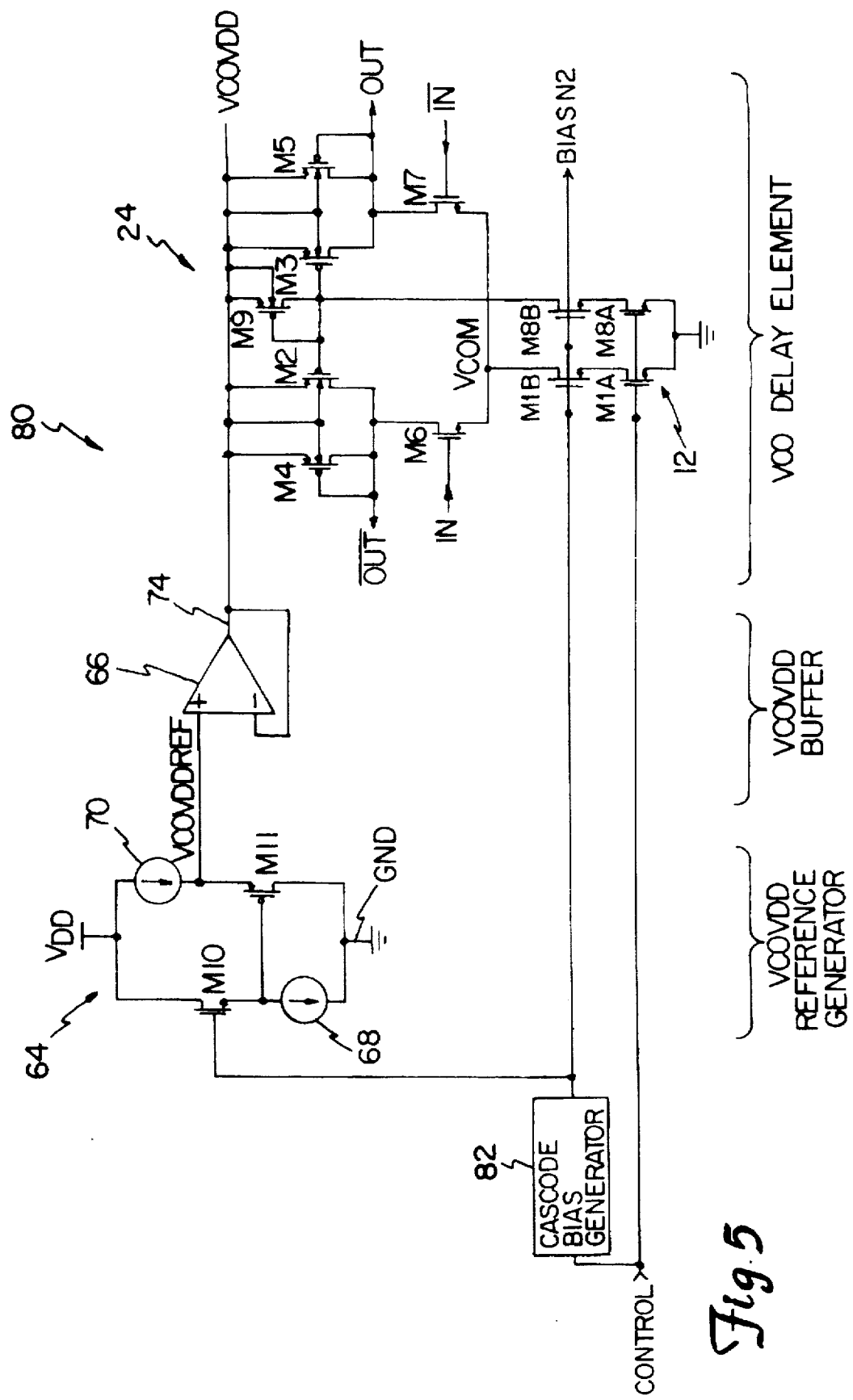

FIG. 5 is a schematic diagram of a differential delay element having a cascoded tail current source according to the present invention.

Figure 6:
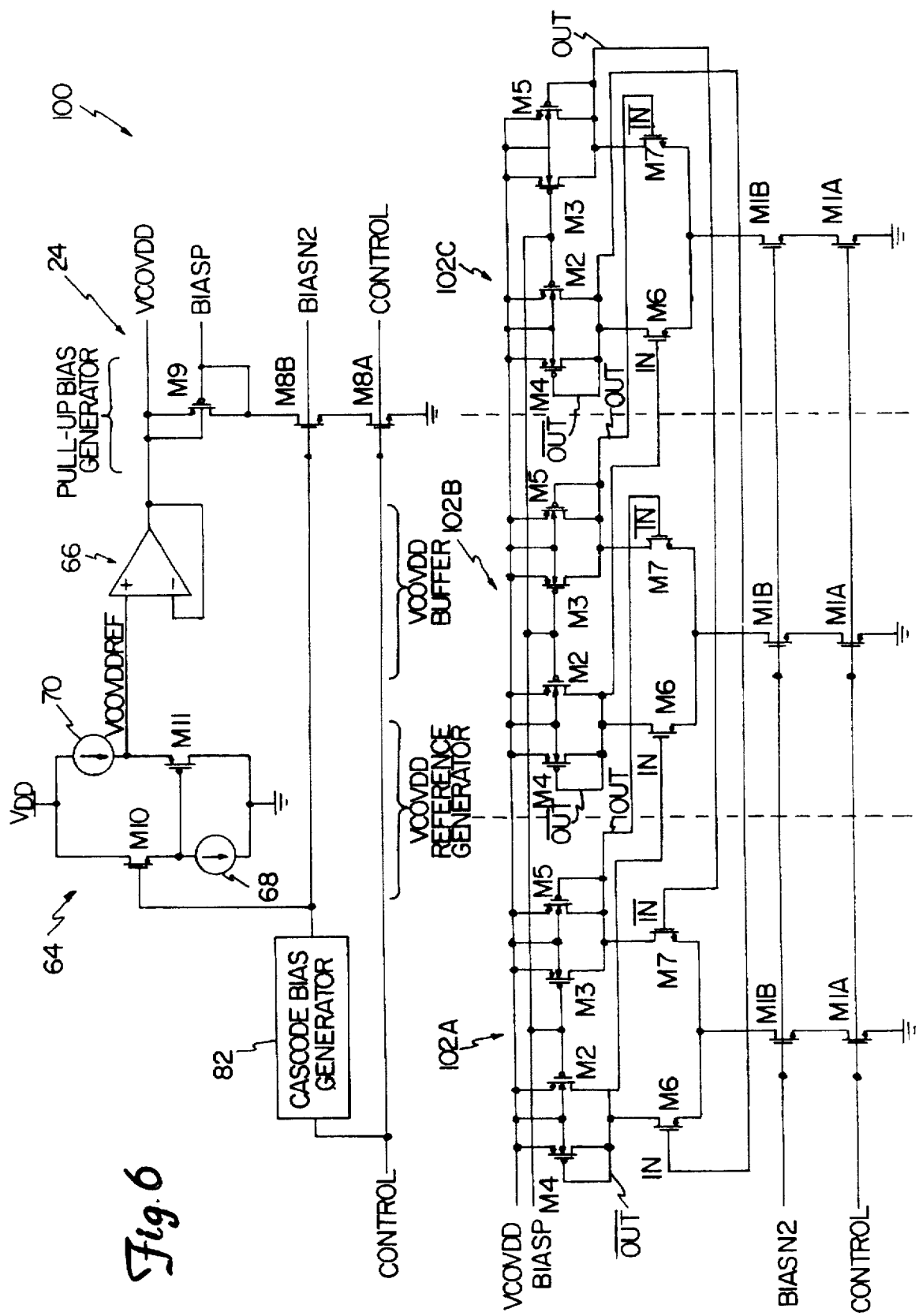

FIG. 6 is a schematic diagram of a three-stage VCO according to the present invention.

DETAILED DESCRIPTION OF THE PREFERRED EMBODIMENTS

Figure 1A:
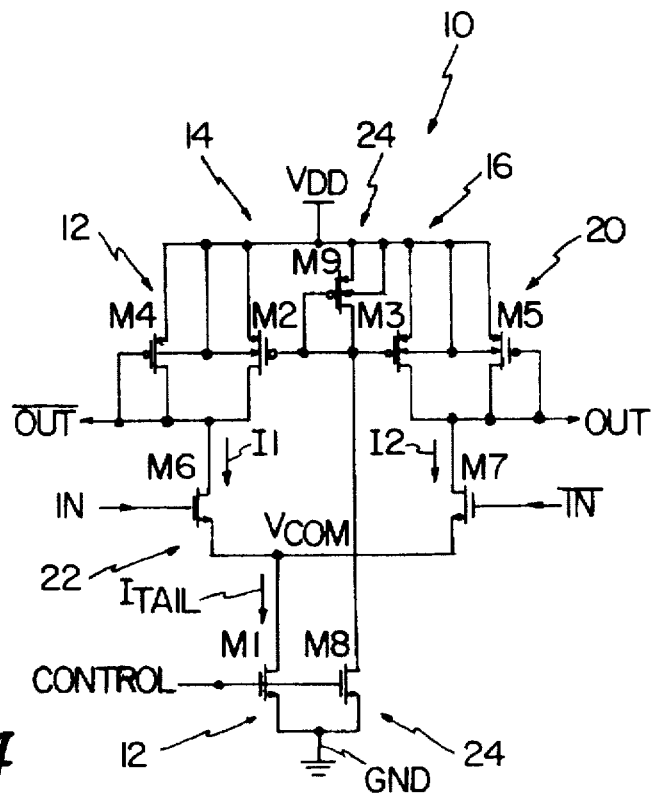
FIGS. 1A and 1B are schematic diagrams of differential delay elements of the prior art.

FIG. 1A is a schematic diagram of a differential delay element of the prior art. For simplicity and ease of description, the same reference numerals in each of the Figures to indicate similar elements. For example, the transistor numbering pattern has been repeated to indicate similarity between a position or function of a transistor in one Figure and a position or function of a similarly numbered transistor in another Figure.

Differential delay element 10 is a basic differential delay element, commonly used for construction of a VCO. Differential delay element 10 includes tail current source 12, pull-up current sources 14 and 16, clamp circuits 18 and 20, current steering circuit 22 and pull-up bias generator 24. Tail current source 12 includes N-channel MOSFET M1 having a gate coupled to control voltage input CONTROL, a source coupled to supply terminal GND and a drain coupled to common voltage node $V_{COM}$. MOSFET M1 generates a tail current $I_{TAIL}$ at its drain as a function of the voltage on control voltage input CONTROL.

Pull-up current sources 14 and 16 include P-channel MOSFETs M2 and M3, respectively. MOSFET M2 has a gate coupled to P-channel bias node BIASP, a source and substrate coupled to supply terminal VDD and a drain coupled to output terminal $\overline{OUT}$. MOSFET M3 has a gate coupled to P-channel bias node BIASP, a source and a substrate coupled to supply terminal VDD and a drain coupled to output terminal OUT. MOSFETs M1, M2 and M3 are sized such that the combined pull-up current provided at the drains of MOSFETs M2 and M3 is one half of the tail current $I_{TAIL}$. The other half of the tail current $I_{TAIL}$ is supplied by clamp circuits 18 and 20.

Clamp circuits 18 and 20 include P-channel MOSFETs M4 and M5, respectfully. MOSFET M4 has a gate and drain coupled to output terminal $\overline{OUT}$ and a source and a substrate coupled to supply terminal VDD. MOSFET M5 has a gate and drain coupled to output terminal OUT and a source and a substrate coupled to supply terminal VDD.

Current steering circuit 22 includes N-channel MOSFETs M6 and M7 which steer the tail current $I_{TAIL}$ through either MOSFET M6 as current I1 or MOSFET M7 as current I2 as a function of the voltages on complementary inputs IN and $\overline{IN}$, respectively. MOSFET M6 has a gate coupled to input IN, a source coupled to common node $V_{COM}$ and, a drain coupled to output terminal $\overline{OUT}$. MOSFET M7 has a gate coupled to input terminal $\overline{IN}$, a source coupled to common node $V_{COM}$ and a drain coupled to output terminal OUT.

Pull-up bias generator 24 includes N-channel MOSFET M8 and P-channel MOSFET M9. N-channel MOSFET M8 has a gate coupled to control voltage input CONTROL, a source coupled to supply terminal GND and a drain coupled to P-channel bias node BIASP. P-channel MOSFET M9 has a gate and drain coupled to P-channel bias node BIASP, and a source and substrate coupled to supply terminal VDD. Pull-up bias generator 24 generates a bias voltage on P-channel bias node BIASP for P-channel MOSFETs M2 and M3.

The switching delay through differential delay element 10 is mostly a function of the voltage applied to control voltage input CONTROL, but is also a function of the voltage at supply terminal VDD. The voltage at common node $V_{COM}$ tracks changes in the voltage at supply terminal VDD, which modulates the drain-source voltage $V_{DS,M1}$ of N-channel MOSFET M1, and thus the current through MOSFET M1 because of the non-zero slope of the current-voltage curve of MOSFET M1 in saturation. This parasitic current modulation then results in a modulation in the switching delay of differential delay element 10 and thus the oscillation frequency of the VCO.

Figure 1B:
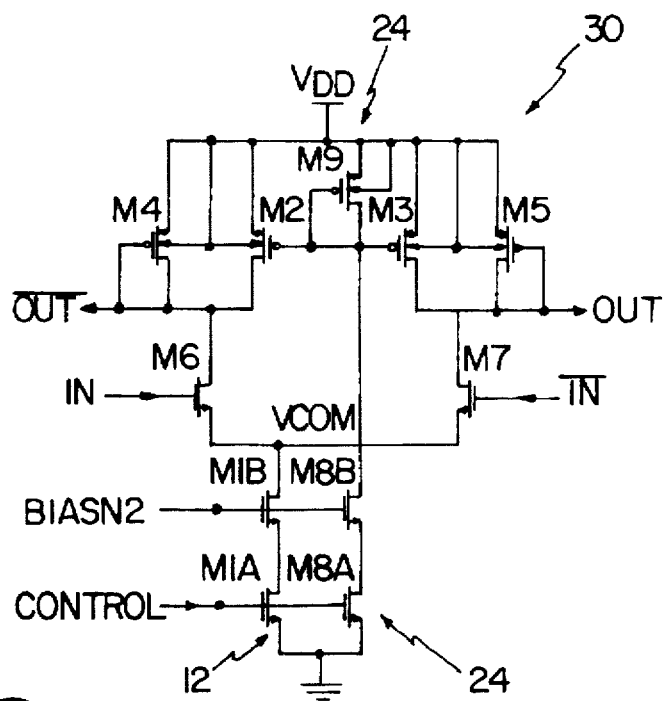

FIG. 1B is a schematic diagram of a differential delay element 30 which is similar to differential delay element 10, but further includes an additional cascode transistor in current source 12 and in pull-up bias generator 24. Current source 12 includes N-channel MOSFETs M1A and M1B which are connected in cascode with one another and are controlled by the voltages on control voltage input CONTROL and bias input BIASN2, respectively. Similarly, pull-up bias generator 24 includes N-channel MOSFETs M8A and M8B which are connected to one another in cascode with one another and are controlled by the voltages on control voltage input CONTROL and bias input BIASN2, respectively. The addition of cascode MOSFETs M1B and M8B, when appropriately biased, dramatically reduces the VCO power supply gain. However, because the voltage on common node $V_{COM}$ will still follow the voltage on supply terminal VDD, as in the circuit shown in FIG. 1A, the tail current $I_{TAIL}$ is still modulated, though to a lesser degree, due to the non-zero slope in the cascode current source's current-voltage characteristic, leakage from the common node $V_{COM}$ to ground, and the body effect in N-channel MOSFET transistors M6 and M7.

Figure 2:
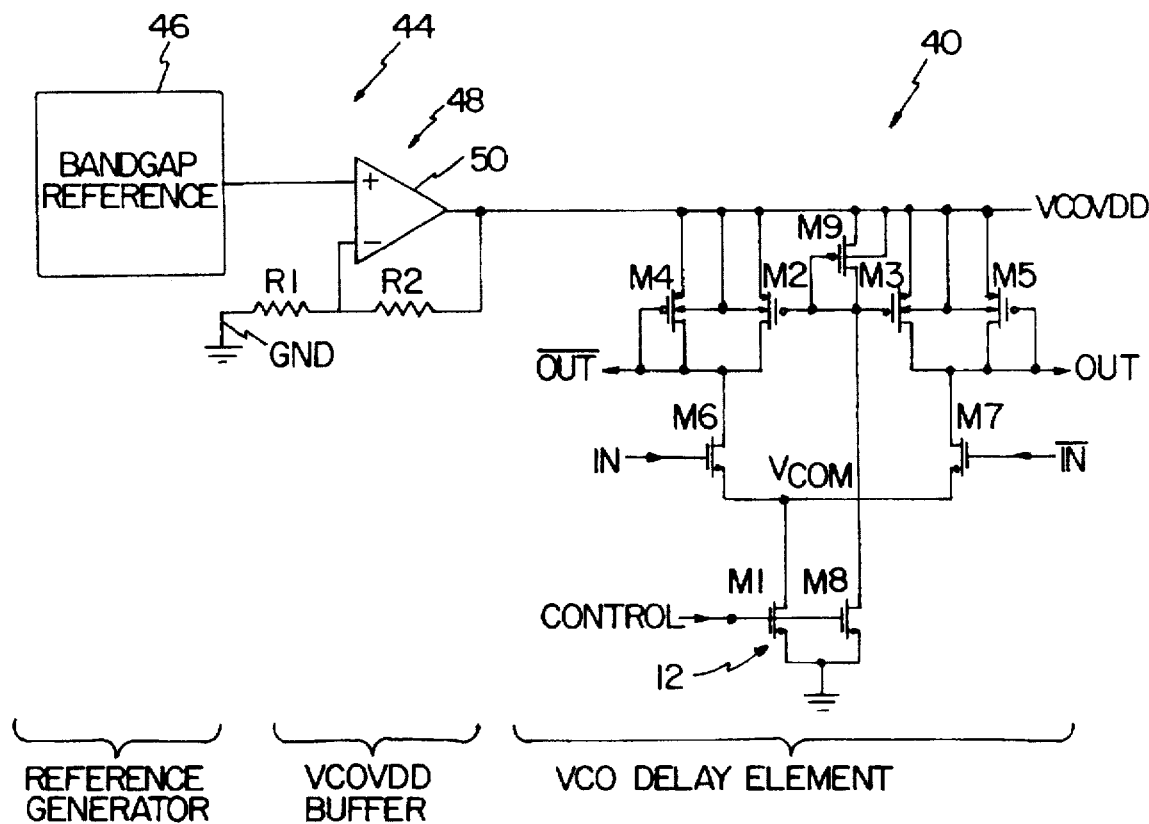
FIG. 2 is a schematic diagram of a differential delay element of the prior art with a bandgap-referenced power supply.

FIG. 2 is a schematic diagram of a differential delay element of the prior art having a bandgap-referenced power supply. Delay element 42 is identical to delay element 10 shown in FIG. 1A. Bandgap-referenced power supply 44 includes bandgap-reference generator 46 and buffer 48. Bandgap-reference generator 46 generates a bandgap-reference voltage for buffer 48. Buffer 48 includes operational amplifier 50 and resistors R1 and R2. Bandgap-reference generator 46 is coupled to the noninverting input of operational amplifier 50. Resistor R1 is coupled between the inverting input of operational amplifier 50 and supply terminal GND. Resistor R2 is coupled between the output of operational amplifier 50 and the inverting input of amplifier 50. Operational amplifier 50 generates a VCO supply voltage VCOVDD on its output as a function of the reference voltage provided by bandgap-referenced generator 46 and the gain of buffer 48. The gain of buffer 48 is chosen such that the voltage on VCOVDD is high enough that N-channel MOSFET M1 of tail current source 12 is in saturation over the expected voltage range on control voltage input CONTROL, but not so high that it exceeds the capability of operational amplifier 50 to drive VCOVDD to that voltage under conditions of minimum VDD.

The power supply gain of a VCO built from multiple differential delay elements 40 and bandgap-referenced power supply 44 is greatly reduced. However, this is at the expense of the additional complexity of the bandgap-reference generator and the buffer. Further, the choice of optimum voltage for VCOVDD over variations in process, voltage and temperature is difficult, as it must be as high as possible so as to provide maximum control range at the control voltage input CONTROL while keeping the transistors in the tail current source in saturation, but not so high as to saturate operational amplifier 50 at any level of process, voltage or temperature.

FIG. 3 is a simplified schematic diagram of a differential delay element according to the present invention. Differential delay element 60 has the same circuit configuration as differential delay element 10 shown in FIG. 1A, but has a CONTROL-referenced power supply circuit 62 in accordance with the present invention. Power supply circuit 62 is coupled between control voltage input CONTROL and supply terminal VCOVDD. Power supply circuit 62 applies a voltage $V_2$ between control voltage input CONTROL and supply terminal VCOVDD. Supply terminal VCOVDD is no longer referenced to a fixed bandgap voltage as in the circuit shown in FIG. 2, but rather is set to voltage $V_2$ above the voltage on control voltage input CONTROL. The voltage $V_2$ is chosen such that N-channel MOSFET M1 of tail current source 12 is biased just into saturation where $V_{DS,M1}=V_{DS,M1,SAT}$, but not excessively in saturation (i.e. $V_{DS,M1}$ more than 100–200 mV above $V_{DS,M1,SAT}$). Referencing the power supply to the voltage on the CONTROL input eliminates the need for a bandgap-reference. The tail current transistors are biased in saturation, and the voltage on supply terminal VCOVDD is substantially independent of VDD.

FIG. 4 is a schematic diagram which illustrates the control-referenced power supply circuit 62 in greater detail. Power supply circuit 62 includes VCOVDD reference generator 64 and VCOVDD buffer 66. VCOVDD reference generator 64 includes current sources 68 and 70, N-channel source follower MOSFET M10 and P-channel source follower MOSFET M11. MOSFET M10 has a gate coupled to control voltage input CONTROL, a source coupled to current source 68 and a drain coupled to supply terminal VDD. Current source 68 is coupled between the source of MOSFET M10 and supply terminal GND. Current source 70 is coupled between supply terminal VDD and the output terminal 72. MOSFET M11 has a gate coupled to the source of MOSFET M10, a source coupled to output terminal 72 and a drain coupled to supply terminal GND. By sizing the source followers formed by MOSFETs M10 and M11 appropriately and biasing them with appropriate bias currents from current sources 68 and 70, an appropriate reference voltage VCOVDDREF is generated on output terminal 72. The voltage VCOVDDREF on output terminal 72 is then buffered with VCOVDD buffer 66. In one embodiment, VCOVDD buffer 66 includes an operational amplifier coupled in a follower mode, with the noninverting input coupled to output terminal 72 and the inverting input coupled to output 74 of the operational amplifier. VCOVDD buffer 66 generates supply voltage VCOVDD on output 74. VCOVDD buffer 66 preferably buffers the VCO supply voltage reference with good stability, which is achieved with a low open-loop gain. VCOVDD buffer 66 preferably has a low input offset voltage which is independent of VDD and the load current. Supply voltage VCOVDD is therefore substantially independent of VDD and has a level such that MOSFET M1 of tail current source 12 is just in saturation. The VCO power supply gain is extremely low, and this is achieved without sacrificing a wide VCO control voltage range (with MOSFET M1 remaining in saturation). In some applications where a wide VCO control range is not required, differential delay element 60 provides for operation of the VCO at a very low minimum VDD power supply voltage.

Although FIGS. 3 and 4 show differential delay element 60 with a single-transistor (non-cascoded) tail current source, additional benefit can be obtained by cascoding the tail current source. FIG. 5 is a schematic diagram which illustrates this modification. Differential delay element 80 is substantially the same as differential delay element 60. However, tail current source 12 includes cascode-connected N-channel MOSFETs M1A and M1B. Similarly, pull-up bias generator 24 includes cascode-connected N-channel MOSFETs M8A and M8B. MOSFETs M1A and M8A have their gates coupled to control voltage input CONTROL while N-channel MOSFETs M1B and M8B have their gates coupled to bias input BIASN2. The additional cascode N-channel MOSFETs M1B and M8B further reduce VCO power supply gain. VCOVDD reference generator 64 sets supply voltage VCOVDD such that MOSFET M1B is just in saturation, but not excessively so.

Bias input BIASN2 is generated by a cascode bias generator 82 which is coupled between control voltage input CONTROL and the gate of N-channel MOSFET M10. Any suitable cascode bias generator can be used with the present invention, such as those disclosed in co-pending U.S. application Ser. No. 08/667,071, filed Jun. 20, 1996, which is entitled HIGH SWING CASCODE CURRENT MIRROR and is hereby incorporated by reference.

FIG. 6 is a schematic diagram of a three stage VCO in accordance with the present invention. VCO 100 includes identical VCO delay elements 102A, 102B and 102C, cascode bias generator 82, VCOVDD reference generator 64, VCOVDD buffer 66 and pull-up bias generator 24. Pull-up bias generator 24 is common to each VCO delay element 102A, 102B, and 102C. Delay elements 102A–102C are coupled together in series with the outputs $\overline{OUT}$ and $\overline{OUT}$ of each delay element coupled to the inputs $\overline{IN}$ and IN, respectively, of the next delay element such that the delay elements will oscillate.

The VCO supply voltage regulator of the present invention generates and regulates the positive supply voltage for a VCO. This supply voltage is referenced to the VCO control voltage which is used to bias the tail current sources of the VCO delay elements. The value of the generated supply voltage is set to a level such that the tail current sources are in saturation, but not excessively so.

Although the present invention has been described with reference to preferred embodiments, workers skilled in the art will recognize that changes may be made in form and detail without departing from the spirit and scope of the invention. For example, although the present invention has been described with reference to a particular differential delay element, other differential delay elements can also be used with the present invention. Also, the present invention is useful with single ended VCO delay elements. The VCO supply voltage regulator of the present invention can be implemented with various technologies other than MOS technology. Any number of VCOVDD reference generators can be used to achieve the desired operating condition $V_{DS,M1}=V_{DS,M1,SAT}$ (for a single transistor case). The voltage supply terminals can be relatively positive or relatively negative, depending upon the particular convention adopted and the technology used. Likewise, the term "coupled" can include various types of connections or couplings and can include a direct connection or a connection through one or more intermediate components.

What is claimed is:

1. A voltage controlled oscillator comprising:
    a least one voltage controlled delay element having first and second voltage supply inputs, a control voltage input, a signal input and a signal output; and
    a reference voltage generator having a reference voltage input coupled to the control voltage input and a voltage output coupled to the first voltage supply input.

2. The voltage controlled oscillator of claim 1 and further comprising:
    a power supply rail and a ground supply rail;
    wherein the second voltage supply input is coupled to the ground supply rail; and
    wherein the reference voltage generator further comprises power and ground inputs which are coupled to the power and ground supply rails, respectively.

3. The voltage controlled oscillator of claim 2 wherein the reference voltage generator further comprises:
    an N-channel source follower and a P-channel source follower coupled together in series between the reference voltage input and the voltage output.

4. The voltage controlled oscillator of claim 3 wherein the reference voltage generator further comprises first and second current sources and wherein:
    the N-channel source follower comprises an N-channel MOSFET having a gate coupled to the reference voltage input, a source coupled to the first current source and a drain coupled to the power supply rail;
    the first current source is coupled between the source of the N-channel MOSFET and the ground supply rail; the second current source is coupled between the power supply rail and the voltage output; and
    the P-channel source follower comprises an P-channel MOSFET having a gate coupled to the source of the N-channel MOSFET, a source coupled to the voltage output and a drain coupled to the ground supply rail.

5. The voltage controlled oscillator of claim 1 and further comprising a buffer coupled between the voltage output of the reference voltage generator and the first voltage supply input.

6. The voltage controlled oscillator of claim 5 wherein the buffer comprises an operational amplifier coupled in a voltage follower configuration.

7. The voltage controlled oscillator of claim 1 and further comprising a cascode bias generator coupled between the control voltage input and the reference voltage input.

8. The voltage controlled oscillator of claim 1 wherein the voltage controlled delay element comprises a single ended voltage controlled delay element.

9. The voltage controlled oscillator of claim 1 wherein the voltage controlled delay element comprises a differential voltage controlled delay element.

10. The voltage controlled oscillator of claim 9 wherein the differential voltage controlled delay element comprises:
    complementary signal inputs and complementary signal outputs;
    a current steering circuit coupled to the complementary signal inputs and steering current between the complementary signal outputs; and
    a tail current source comprising a first MOSFET with a gate coupled to the control voltage input, a drain coupled to the current steering circuit and a source coupled to the second voltage supply input.

11. The voltage controlled oscillator of claim 10 wherein the tail current source further comprises a second MOSFET coupled in cascode to the first MOSFET, with a gate forming a bias input, and a source and drain coupled between the current steering circuit and the drain of the first MOSFET.

12. The voltage controlled oscillator of claim 11 and further comprising a cascode bias generator coupled between the control voltage input and the bias input.

13. The voltage controlled oscillator of claim 10 wherein the first MOSFET has a drain-source saturation voltage $V_{DS,SAT}$ and the reference voltage generator comprises means for generating a reference supply voltage on the first supply voltage input at a voltage level such that the first MOSFET has a voltage drop $V_{DS}$ across its drain and source which is substantially equal to $V_{DS,SAT}$.

14. A VCO delay element comprising:

first and second voltage supply terminals;

delay means coupled between the first and second voltage supply terminals for receiving an input signal on a signal input and generating an output signal on a signal output which is delayed as a function of a control voltage received on a control voltage input; and means for generating a supply voltage on the first voltage supply terminal as a function of the control voltage.

15. A method of powering a VCO delay element having a signal input, a signal output and a control voltage input, the method comprising:

powering the VCO delay element with first and second supply voltages;

receiving a control voltage on the control voltage input; and generating one of the first and second supply voltages as a function of the control voltage.

16. An integrated circuit comprising:

a power supply rail and a ground supply rail;

a VCO delay element having a power input, a ground input, a control voltage input and an output, wherein the ground input is coupled to the ground supply rail; and a VCO reference voltage generator having power and ground inputs coupled to the power and ground supply rails, respectively, a reference voltage input coupled to the control voltage input and a voltage output coupled to the power input of the VCO delay element.

\* \* \* \* \*